(12) United States Patent
Ina

(10) Patent No.: US 6,940,586 B2
(45) Date of Patent: Sep. 6, 2005

(54) EXPOSURE APPARATUS AND METHOD

(75) Inventor: Hideki Ina, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/752,120

(22) Filed: Jan. 5, 2004

(65) Prior Publication Data

US 2004/0135981 A1 Jul. 15, 2004

(30) Foreign Application Priority Data

Jan. 6, 2003 (JP) ....................................... 2003-000112

(51) Int. Cl.⁷ ............................ G03B 27/52; G03B 27/68
(52) U.S. Cl. ........................................ 355/55; 335/52
(58) Field of Search ............................. 355/52, 53, 55, 355/67, 399–401; 250/548

(56) References Cited

U.S. PATENT DOCUMENTS

| 5,448,332 | A | | 9/1995 | Sakakibara et al. ........... 355/53 |
| 5,737,063 | A | * | 4/1998 | Miyachi ....................... 355/53 |
| 5,750,294 | A | | 5/1998 | Hasegawa et al. ............. 430/22 |
| 6,473,156 | B2 | * | 10/2002 | Kataoka ....................... 355/53 |
| 6,654,096 | B1 | * | 11/2003 | Fujita et al. .................. 355/52 |
| 6,813,001 | B2 | * | 11/2004 | Fujisawa et al. .............. 355/53 |

FOREIGN PATENT DOCUMENTS

| JP | 6-260391 | 9/1994 |
| JP | 6-283403 | 10/1994 |
| JP | 9-45609 | 2/1997 |

* cited by examiner

Primary Examiner—Henry Hung Nguyen
(74) Attorney, Agent, or Firm—Morgan & Finnegan, LLP

(57) ABSTRACT

An exposure method for exposing a pattern onto plural portions on an object includes the steps of obtaining first flatness information about the plural portions, specifying a portion among the plural portions, which has flatness information that meets a predetermined condition among the first flatness information, obtaining second flatness information that is more detailed than the first flatness information about the portion specified by the specifying step, and exposing, based on the second flatness information, the portion that has been specified.

12 Claims, 12 Drawing Sheets

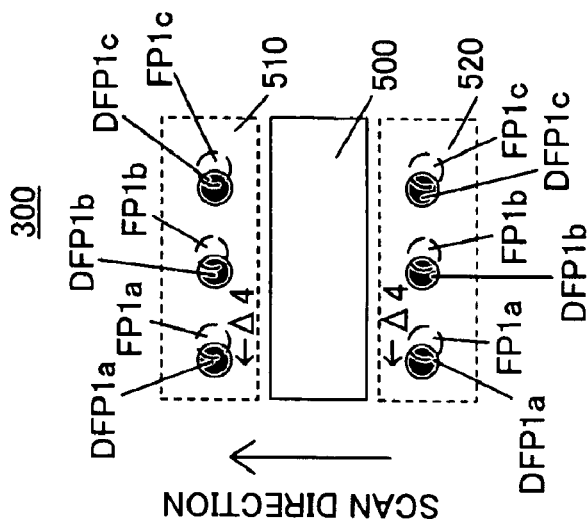
FIG. 6
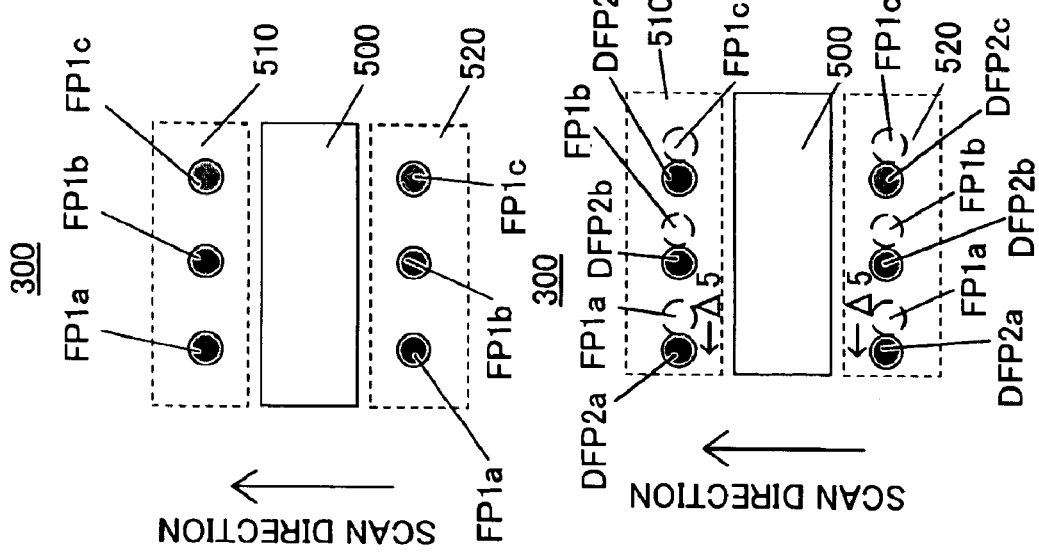
FIG. 5
FIG. 7

EXPOSURE APPARATUS AND METHOD

This application claims a benefit of priority based on Japanese Patent Application No. 2003-000112, filed on Jan. 6, 2003, which is hereby incorporated by reference herein in its entirety as if fully set forth herein.

BACKGROUND OF THE INVENTION

The present invention relates generally to an exposure method and apparatus used to expose an object, such as a single crystal substrate for a semiconductor wafer and a glass plate for a liquid crystal display ("LCD")

Reduction projection exposure apparatuses have been conventionally employed which use a projection optical system for projecting a circuit pattern formed on a mask (reticle) onto a wafer, etc. and for transferring the circuit pattern, in manufacturing such devices as semiconductor devices, LCD devices and thin-film magnetic heads in the photolithography technology.

Along with finer and more highly integrated ICs, the projection exposure apparatus has been required to expose a circuit pattern on a reticle onto a wafer with high resolving power. The minimum critical dimension to be transferred by the projection exposure apparatus (resolution) is proportionate to a wavelength of light used for exposure, and inversely proportionate to the numerical aperture ("NA") of the projection optical system. The shorter the wavelength is, the better the resolution is. Accordingly, the recent light sources have been in transition from an ultra-high pressure mercury lamp (g-line with a wavelength of approximately 436 nm) and i-line with a wavelength of approximately 365 nm) to KrF excimer laser (with a wavelength of approximately 248 nm) and ArF excimer laser (with a wavelength of approximately 193 nm). Practical use of $F_2$ excimer laser (with a wavelength of 157 nm) has been promoted.

A step-and-repeat exposure apparatus (also referred to as a "stepper") for entirely projecting and exposing an approximately square exposure area onto a wafer with a reduced exposure area has been replaced mainly with a step-and-scan exposure apparatus (also referred to as a "scanner") for accurately exposing a wide screen of exposure area through a rectangular slit with relatively and quickly scanning the reticle and the wafer.

In exposure, the scanner uses a surface-position detector having an oblique light projection system to measure a surface position at a certain position on the wafer before the exposure slit area moves to the certain position on the wafer, and accords the wafer surface with an optimal exposure image-surface position when exposing the certain position, thereby reducing influence of the flatness of the wafer. In particular, there are plural measurement points in longitudinal direction of the exposure slit, i.e., a direction orthogonal to the scan direction, at front and back stages to the exposure slit area to measure an inclination or tilt of the surface as well as a height or focus of the wafer surface position. In general, the scan exposure proceeds in both directions from the upper stage and from the back stage (see, for example, Japanese Patent Application Publication No. 9-45609 corresponding to U.S. Pat. No. 5,750,294).

Japanese Patent Application Publication No. 6-260391 (corresponding to U.S. Pat. No. 5,448,332) proposes, as a method for measuring a surface position on a wafer in a scanner and for correction the same, an arrangement of plural measurement points on a pre-scan area other than the exposure area to measure the focus and tilt in scan and non-scan directions. Japanese Laid-Open Patent Application No. 6-283403 (corresponding to U.S. Pat. No. 5,448,332) proposes as a method for measuring the focus and tilt in the scan and non-scan directions and for driving and correcting the same, by arranging plural measurement points in the exposure area.

A description will be given of these proposals with reference to FIGS. 18 and 19. Here, FIG. 18 is a schematic sectional view of focus and tilt measurement points FP1 to FP3 on the wafer 1000. FIG. 19 is a schematic sectional view showing the wafer 1000 that has been driven to an optimal exposure image-surface position based on the measurement results. Referring to FIG. 18, the focus and tilt are sequentially measured at the measurement points FP1 to FP3 on the wafer 1000. A pre-scan plane PMP is calculated based on the measurement results from the measurement points FP1 to FP3, and the orientation of the wafer is driven and adjusted to the best focus plane BFP in moving the wafer 1000 to the exposure are an exposure slit 2000, as shown in FIG. 19.

However, the recent increasingly shortened wavelength of the exposure light and the higher NA of the projection optical system have required an extremely small depth of focus ("DOF") and a stricter accuracy with which the wafer surface to be exposed is aligned to the best focus position BFP or so-called focus accuracy.

In particular, they have also required stricter measurement and precise correction of the tilt of the wafer surface in the scan direction or width direction of the exposure slit. A wafer having an insufficiently flat surface has disadvantageous focus detection accuracy. For example, when the exposure apparatus has a DOF with 0.4 μm, the flatness of the wafer requires several nanometer order, for example, the flatness of the wafer needs 0.08 μm where it is one-fifth as long as the DOF, or 0.04 μm where it is one-tenth as long as the DOF. In addition, while a surface-position detector having the oblique light projection system measures the wafer's surface position before the area hangs over the exposure slit, the measurement timing is discrete and no information is available or considered about the wafer's flatness between two timings. As a result, there is no information available between timings of the flatness of the wafer.

For example, this measurement timing is at an interval of 2 mm on the wafer 1000 in the scan direction as shown in FIG. 20. Then, the wafer 1000 has such an insufficient flatness due to lack of the information for a distance of 2 mm, e.g., between points P1 to P2 in FIG. 20 that the front position may offset by Δ from the pre-scan plane PMP calculated by the measurement at the interval of 2 mm. Here, FIG. 20 is a schematic sectional view showing an offset of flatness between the pre-scan plane PMP and the wafer 1000.

In exposure, the pre-scan plane PMP is adjusted to the best focus plane BFP, and the exposure in FIG. 20 needs a shift by the amount of Δ. This shift occurs in a direction orthogonal to the scan direction as well as the scan direction. This is due to an arrangement of measurement points of the above oblique light projection system, rather than the measurement timing.

The finer measurement timing in the scan direction and the increased number of measurement points in the oblique light projection system would reduce an offset error, but might disadvantageously lower the throughput due to the deteriorated scan speed in exposure time, increase measurement time, rise cost together with the complicated apparatus structure, and grows likelihood of troubles.

BRIEF SUMMARY OF THE INVENTION

Accordingly, it is an exemplified object of the present invention to provide an exposure method and apparatus for performing a superior focus correction for the wafer surface without lowering throughput.

An exposure method of one embodiment according to the present invention for exposing a pattern onto plural portions on an object includes the steps of obtaining first flatness information about the plural portions, specifying a portion among the plural portions, which has flatness information that meets a predetermined condition among the first flatness information, obtaining second flatness information that is more detailed than the first flatness information about the portion specified by the specifying step; and exposing, based on the second flatness information, the portion that has been specified.

The first flatness information may be obtained based on measurement values of the first number of measurement points, while the second flatness information may be obtained based on measurement values of the second number of measurement points greater than the first number. The step of obtaining the second flatness information may be executed after the plural portions are exposed. The exposure method may expose each portion plural times and the step of obtaining the first flatness information may be executed at an initial exposure for the portion.

An exposure apparatus of another embodiment according to the present invention for exposing a pattern onto plural portions on an object includes a memory for storing, as a database, first flatness information for a first portion among the plural portions, and second flatness information for a second portion among the plural portions different from the first portion, the second flatness information being more detailed than the first flatness information, and a controller for controlling exposure based on the database stored in the memory. The exposure may further include a drive mechanism for driving an orientation of the object, wherein the controller controls the drive mechanism based on the database.

A device manufacture method includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

A database of still another aspect according to the present invention that indicates flatness information of plural portions on an object to be exposed includes first flatness information for a first portion among the plural portions, and second flatness information for a second portion different from the first portion, the second flatness information being more detailed than the first flatness information.

Other objects and further features of the present invention will become readily apparent from the following description of the embodiments with reference to accompanying drawings.

BRIEF DESCRIPTION OF THE DRAWINGS

FIG. 5 is a schematic sectional view of a wafer showing one exemplary measurement to obtain detailed flatness information of the specific shot in a direction orthogonal to the scan direction.

FIG. 6 is a schematic sectional view of a wafer showing one exemplary measurement to obtain detailed flatness information of the specific shot in the direction orthogonal to the scan direction.

FIG. 7 is a schematic sectional view of a wafer showing one exemplary measurement to obtain detailed flatness information of the specific shot in the direction orthogonal to the scan direction.

DETAILED DESCRIPTION OF THE PREFERRED EMBODIMENTS

The instant inventor has discovered that the flatness of the wafer, in particular, the flatness among measurement points (e.g., at an interval of 2 mm) of a wafer supported on a wafer chuck in an exposure apparatus does not vary during a semiconductor process. In other words, the flatness of the original wafer without a resist or pattern before the semiconductor fabrication process is the same as the flatness of the wafer that has experienced the process including, for example, an oxide-film formation and a metal process.

A process that heats up the entire wafer might cause a whole contraction, a temperature difference between the front and rear surfaces, and thus a rough shape as a whole. However, when the wafer is held by a wafer chuck in an exposure apparatus, which rectifies its flatness, the wafer surface does not have such a rough shape. The issue in this case is the flatness in a minute interval of, for example, 2 mm that has existed in the wafer before the semiconductor fabrication process.

Figure 1:
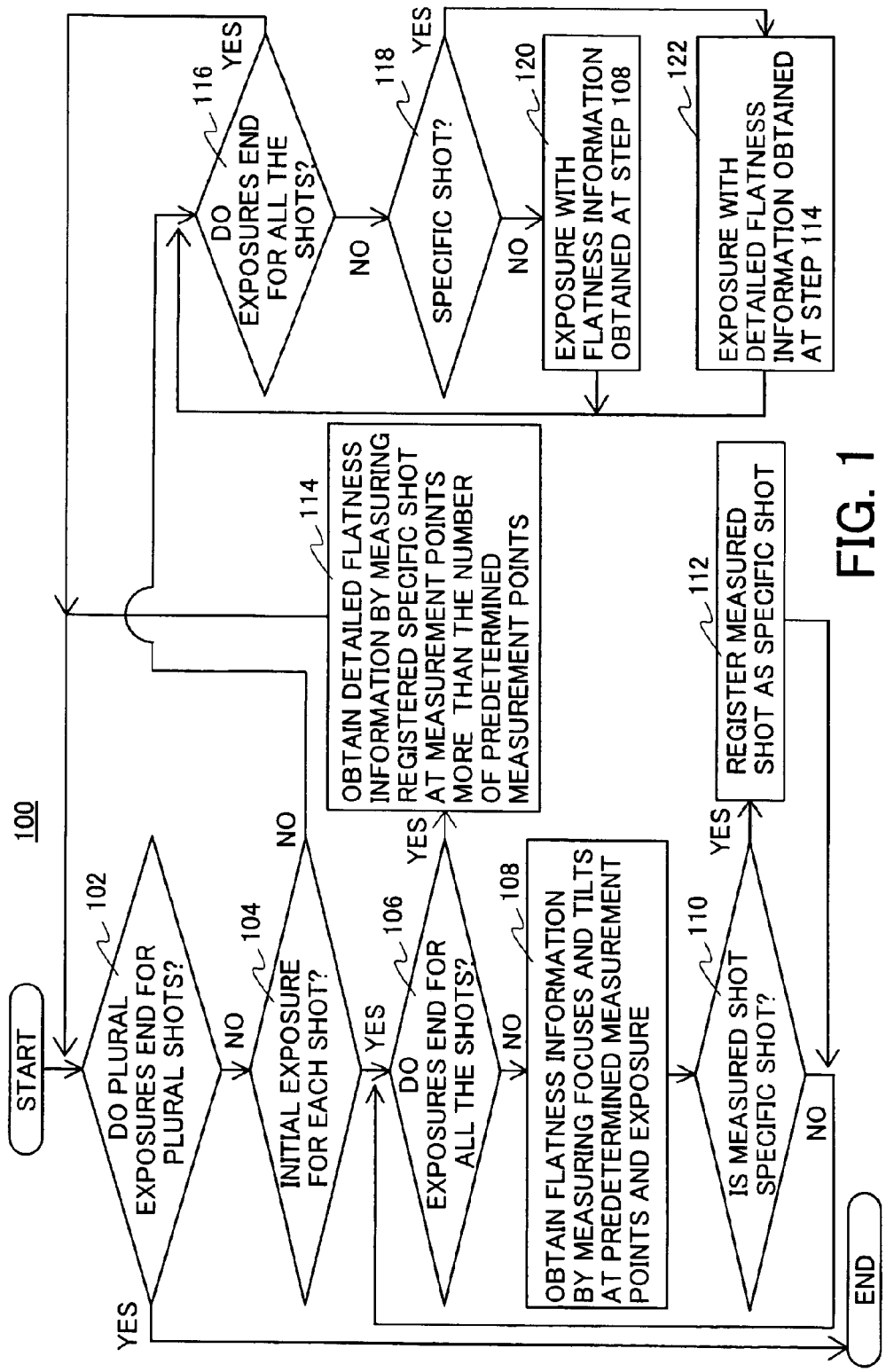
FIG. 1 is a flowchart for explaining an exposure method as one embodiment according to the present invention.

A description will now be given of an exposure apparatus and method of one embodiment according to the present invention with reference to the accompanying drawings. In each figure, the same member is designated by the same reference numeral, and a description thereof will be omitted. Here, FIG. 1 is a flowchart for explaining an exposure method 100 as one embodiment according to the present invention.

The exposure method 100 is one that exposes a desired pattern onto plural portions or shots on the wafer. The desired pattern is transferred on each shot area on the wafer through plural exposures. FIG. 1 shows an exposure flow for one wafer in a semiconductor process in the lithography from the beginning to the end.

One piece of wafer is first introduced into a semiconductor process, and carried in the exposure apparatus so as to be exposed. It is determined whether plural shots have been exposed plural times or have experienced plural exposure processes (step 102). When plural shots have been exposed plural times or have experienced plural exposure processes, the exposure ends since a desired pattern has been transferred on each of the plural shots on the wafer. When it is determined that plural shots have not yet been exposed plural times or have experienced plural exposure processes, it is then determined whether the exposure is the initial exposure for each shot or whether it is a first exposure process (step 104). When it is not the first exposure process, then the procedure moves to step 116 below, and when it is the first exposure process, then it is determined whether all of the plural shots on the wafer have experienced the first exposure process (step 106). When it is determined that all the plural shots on the wafer have not experienced the first exposure process, flatness information is obtained at predetermined measurement points as a result of focus and tilt measurements and the first exposure process is conducted for a shot that has not experienced exposure of the first exposure process (step 108). Similar to the prior art, the focus and tilt are measured by obliquely illuminating measurement points of the shot that are arranged at intervals (for example, at two-millimeter intervals) and detecting reflected light from these measurement points using a sensor. In addition, flatness information is obtained from the measured focuses and tilts, and the wafer is exposed while focus and tilt are driven based on this information. While the flowchart shown in FIG. 1 shows a focus/tilt measurement and exposure once for each shot, an actual exposure scans the wafer and reticle, while focus and tilt are measured before the exposure, thus repeating focus/tilt measurements and exposure plural times.

Then, a shot is specified that has the flatness information obtained at the step 108 worse than preset flatness information (step 110). If the flatness information obtained at the step 108 is not worse than the preset flatness information, the procedure returns to the step 106 for exposure of the next shot; if the flatness information obtained at the step 108 is worse than the preset flatness information, the procedure returns to the step 106 after registering it as a specific shot (step 112) so as to expose the next shot.

Suppose that the threshold is set, for example, to be 0.1 µm in advance. Those shots which have measurements points at intervals (for example, at two-millimeter intervals) in which a difference between continuous measurement values is greater than the preset threshold, are designated as a specific shot having worse flatness information.

The next shot is also subject to the focus and tilt measurements at its predetermined measurement points for flatness information, and the exposure (step 108). A specification of a shot having worse flatness information than the preset flatness information (step 110), and a registration of the specific shot (step 112) are repeated and all the shots are exposed.

When all of the plural shots on the wafer are exposed in the first exposure process (step 106), the step 112 measures focus and tilt at measurement points more than the predetermined measurement points, and obtains detailed flatness information (step 114). In other words, the specific shot is subject to focus and tilt measurements at measurement points more than the predetermined measurement points (for example, at point-five-millimeter intervals rather than at two-millimeter intervals in the step 108) so as to obtain detailed flatness information than that obtained in the step 108.

Figure 2:
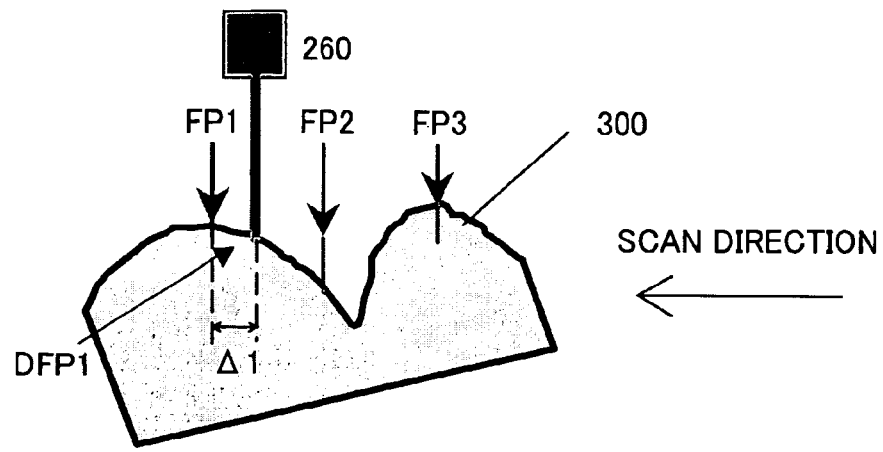
FIG. 2 is a schematic sectional view of a wafer showing one exemplary measurement to obtain detailed flatness information of a specific shot in a scan direction.
Figure 3:
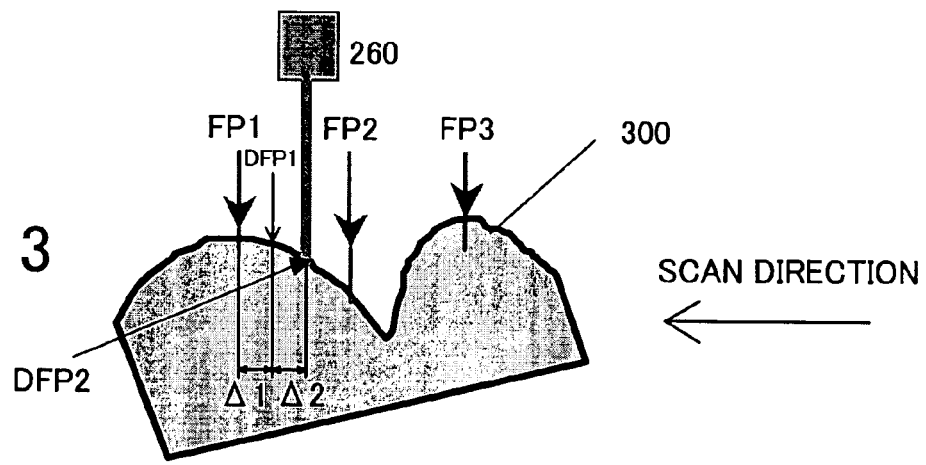
FIG. 3 is a schematic sectional view of a wafer showing one exemplary measurement to obtain detailed flatness information of the specific shot in a scan direction.
Figure 4:
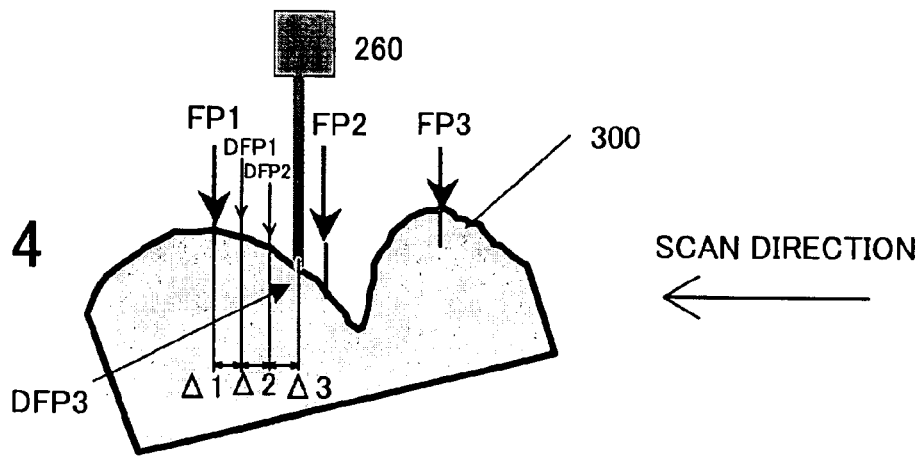
FIG. 4 is a schematic sectional view of a wafer showing one exemplary measurement to obtain detailed flatness information of the specific shot in a scan direction.

Here, a description will be given of an exemplary method of obtaining detailed flatness information with reference to FIGS. 2 to 7. FIGS. 2 to 4 are schematic sectional views of a wafer showing an exemplary measurement for obtaining detailed flatness information for a specific shot in the scan direction, whereas FIGS. 5 to 7 are schematic plane views of a wafer showing an exemplary measurement for obtaining detailed flatness information for the specific shot in the scan direction.

In FIGS. 2 to 4, FP1, FP2, and FP3 on the wafer 300 are the measurement points arranged at intervals for focus and tilt measurements. According to one numerical example, a distance between FP1 and FP2 and a distance between FP2 and FP3 are 2 mm.

As shown in FIG. 2, the wafer 300 is driven by a minute amount Δ1, such as 0.5 mm, in the scan direction without changing position of the wafer 300 in the focus direction or direction Z. Then, the detection system 260, which will be described later, measures focus and tilt at a detailed measurement point DFP1 between the measurement points FP1 and FP2. Next, the wafer 300 is further driven by a minute amount Δ2, such as 0.5 mm, in the scan direction without changing position of the wafer 300 in the focus direction or direction Z. Then, as shown in FIG. 3, the detection system 260 measures focus and tilt at a detailed measurement point DFP2 between the measurement points FP1 and FP2 different from the detailed measurement point DFP2. Similarly, the wafer 300 is further driven by a minute amount Δ3, such as 0.5 mm, in the scan direction so that the wafer 300 does not change in the focus direction or direction Z. Then, as shown in FIG. 4, the detection system 260 measures focus and tilt at a detailed measurement point DFP3 between the measurement points FP1 and FP2 different from the detailed measurement points DFP1 and DFP2. Thereby, the focuses and tilts at these detailed measurement points DFP1, DFP2 and DFP3 arranged at point-five-millimeter intervals can be obtained between the measurement points FP1 and FP2, and the flatness information may be obtained from the focuses and tilts of the detailed measurement points DFP1, DFP2 and DFP3 in addition to the measurement points FP1 and FP2. Thereby, repetitive minute driving of the wafer 300 in the scan direction could obtain detailed flatness information of the specific shot in the scan direction, and the minute driving amount can adjust necessary detailed flatness information.

FIG. 5 shows points FP1a, FP1b and FP1c arranged at intervals on the front and back stages 510 and 520 on an exposure area 500 on the wafer 300 for use with focus and tilt measurements, and the detection system 260 measures the focus and tilt at these points FP1a, FP1b and FP1c.

As shown in FIG. 6, the wafer 300 is driven by a minute amount Δ4, such as 0.5 mm, in a direction orthogonal to the scan direction without changing position of the wafer 300 in the focus direction or direction Z. Then, the detection system 260 measures focuses and tilts at these detailed measurement points DFPa, DFPb and DFPc. As shown in FIG. 7, the wafer 300 is driven by a minute amount Δ5, such as 0.5 mm, in a direction orthogonal to the scan direction without changing position of the wafer 300 in the focus direction or direction Z. Then, the detection system 260 measures focuses and tilts at these detailed measurement points DFP2a, DFP2b and DFP2c. Thereby, the focuses and tilts at these detailed measurement points DFPb and DFP2b between the measurement points FPa and FPb and the detailed measurement points DFPc and DFP2c between the measurement points FPb and FPc, and the detailed flatness information may be obtained from the focuses and tilts at the measurement points FPa through FPc and detailed measurement points DFPb, DFP2b, DFPc and DFP2c. Thus, repetitive minute driving of the wafer 300 in the direction orthogonal to the scan direction could obtain detailed flatness information of the specific shot in the scan direction, and the minute driving amount can adjust necessary detailed flatness information.

The obtained detailed flatness information of the specific shot is stored as a database in a memory for use with exposure in a second exposure process. After the detailed flatness information is obtained for the specific shot(s), the procedure returns to the steps 102 and 104, followed by the second exposure process. The second exposure process determines, similar to the first exposure process, whether all the plural shots on the wafer are exposed (step 116). When it is determined that all the plural shots on the wafer have not yet exposed, it is determined whether the shot to be exposed is the specific shot (step 118). When it is not the specific shot, the wafer is exposed based on the flatness information of the step 108 while its focus and tilt are driven (step 120). On the other hand, when it is the specific shot, the wafer is exposed based on the detailed flatness information obtained at the step 114 while its focus and tilt are driven (step 122).

A description will now be given of focus and tilt driving of a wafer based on detailed flatness information obtained at the step 114. In FIGS. 2 and 3, the measurements to obtain the detailed flatness information use the detailed measurement points DFP1 and DFP2. On the other hand, when an interval or a sampling pitch between the detailed measurement points DFP1 and DFP2 is set to be 0.5 mm, the focus and tilt are driven on the wafer surface in a scan exposure, for example, of a point-five-millimeter pitch so that a difference between a target value to control the focus and tilt and each detailed measurement point becomes minimum.

For example, the method may use an interferometer to previously measure the degree of changing flatness of a wafer to be used, and set a sampling pitch based on the measurement result, preventing the measurement from using an unnecessarily detailed sampling pitch.

A initial few wafers are measured at minute intervals, such as every 0.1 mm, and the tendency of deviation of the wafer flatness is evaluated based on the measurement result, and the sampling pitch may be set based on the flatness deviation tendency subsequent to the initial few wafers. The sampling pitch may be set by Fourier-converting the wafer flatness information so that the special frequency becomes a certain threshold.

After a certain shot is thus exposed, the procedure moves to the next shot, and the steps 120 and 122 are repeated so as to expose the plural shots on the wafer. When one wafer receives exposures of all the exposure processes, the exposure process ends in the semiconductor manufacture.

The instant embodiment assumes that when the initial focus and tilt measurements at measurement points arranged at intervals greatly fluctuate, the flatness deteriorates between these measurement points and detailed flatness information is obtained between measurement points. On the other hand, the instant embodiment assumes that when the initial focus and tilt measurements at measurement points arranged at intervals do not greatly fluctuate, the flatness does not deteriorate between these measurement points, and detailed flatness information is not obtained. Therefore, only the focuses and tilts of those shots which have bad flatness are measured, and the good focus correction and good through put are maintained by reducing the sampling error in measuring the shot having worse flatness.

While FIG. 1 describes focus measurements and exposure on one wafer, this applies to plural wafers by treating each wafer as that in FIG. 1.

The initial exposure process in the instant embodiment cannot control sampling errors of the wafer flatness. As discussed above, this is because the initial exposure process conducts exposure first, then measures the focus and tilt, specifies a shot that has bad flatness information, and obtains detailed flatness information only for the specific shot. Nevertheless, this is not problematic in a semiconductor process, since the initial exposure process is for a relatively rough critical dimension, such as a well, not a critical exposure process that emphasizes a sampling error and attempts to secure a focus margin as long as possible. Rather, utilizing the fact that the initial process is not a critical process, the present invention locates, subsequent to the exposure, a prospectively problematic shot for the future process based on the focus and tilt measurements at the time of exposure, and executes detailed measurements. Thus, the present invention may achieve a satisfactory focus correction with minimum throughput reduction.

Figure 8:
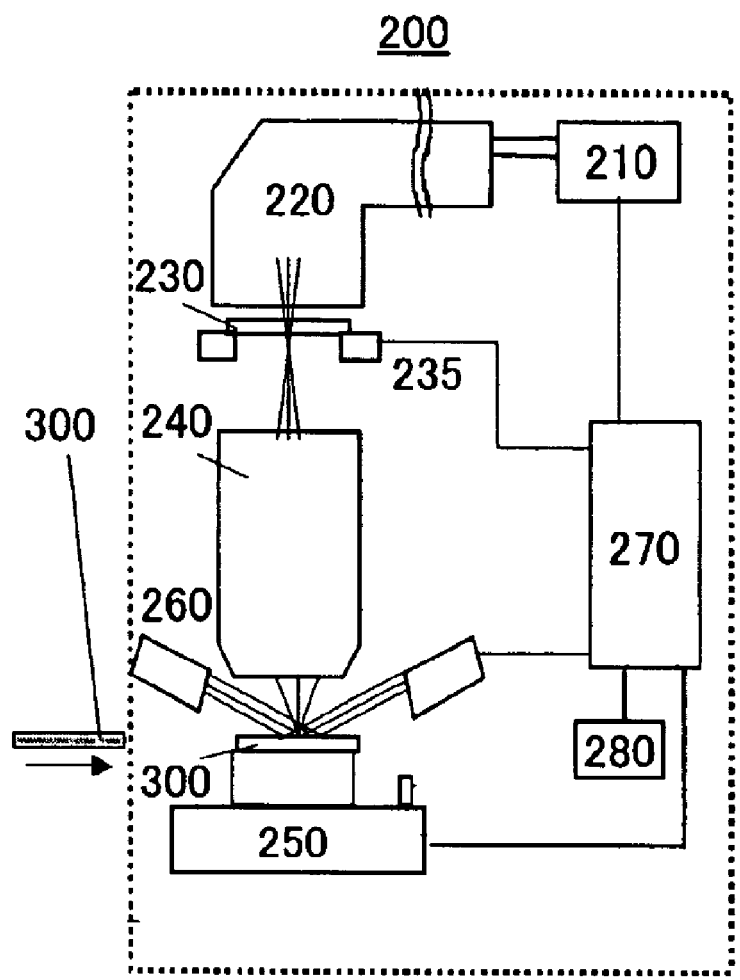
FIG. 8 is a schematic block diagram of an exposure apparatus of one embodiment according to the present invention.

A description will now be given of an exposure apparatus as one aspect according to the present invention, with reference to FIGS. 8 to 14. FIG. 8 is a schematic block diagram of the exposure apparatus 200 of one embodiment according to the present invention. The has an exposure mode that may perform the above exposure method 100, and serves as a projection exposure apparatus that exposes onto a wafer 300 a circuit pattern created on a reticle 230, e.g., in a step-and-repeat or a step-and-scan manner. Such an exposure apparatus is suitable for a sub-micron or quarter-micron lithography process, and this embodiment exemplarily describes a step-and-scan exposure apparatus (which is also called "a scanner").

The light emitted from a light source 210, such as an excimer laser, illuminates a pattern formed on a reticle 230 through an illumination optical system 220 that converts the light into exposure light with an optimal shape. The pattern on the reticle 230 includes an IC circuit pattern to be exposed, and the light emitted through the pattern forms an image near the wafer 300 surface as an image surface through a projection optical system 240.

The reticle 230 is mounted on a reticle stage 235 movable in a plane orthogonal to an optical axis of the projection optical system 240 and in the optical-axis direction.

The wafer 300 is brought in from a coater (not shown) that applies resist, and mounted on a wafer stage 250 movable in a plane orthogonal to an optical axis of the projection optical system 240 and in the optical-axis direction.

The controller 270 controls each unit, calculates flatness information from focus and tilt information of the wafer 300 measured by the detection system 260, which will be discussed below, and stores the result as a database that correlates the flatness information with each shot.

The memory 280 is connected to the controller 270 and stores flatness information for each shot necessary for the controller 270 to control the wafer stage 250. The memory 280 stores, as the database, the flatness information for each shot on the wafer 300 calculated by the controller 270, and the controller 270 refers to the database whenever it handles exposure for each shot.

During the scan exposure of one shot, the controller 270 obtains through the detection system 260 surface position information on the surface of the wafer 300 to measure the focus and tilt, calculates the offset amount from the exposure image surface, and drives the stage 250 in focus (or height) and tilt (or inclination) directions, aligning the wafer 300 surface in the height direction for almost each exposure slit.

The detection system 260 uses an optical height measurement system using a method for introducing light to the wafer 300 surface at a large angle (or low incident angle) and detecting an image offset of the reflected light from the wafer using a position detecting element, such as a CCD camera. It projects light to plural measurement points on the wafer 300, introduces each light to an individual sensor, and calculates the tilt of a surface to be exposed based on the height measurement information of different positions.

Figure 9:
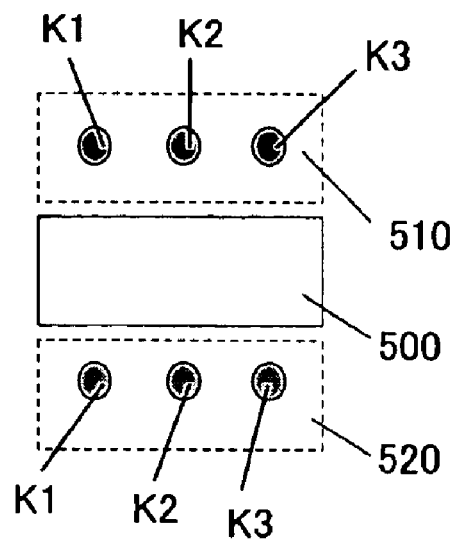
FIG. 9 is a schematic plane view of an exposure area that arranges three measurement points.
Figure 10:
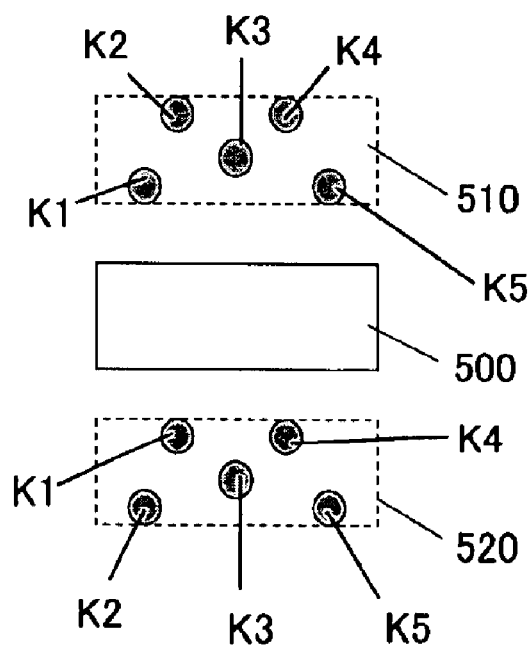
FIG. 10 is a schematic plane view of an exposure area that arranges five measurement points.

Plural measurement points K1 to K5 are arranged, as shown in FIGS. 9 and 10, to form a surface shape in the front and back areas 510 and 520 in the exposure area 500 (or exposure slit) 500, so as to simultaneously measure focus and tilt information of the wafer 300, in particular, tilt information in the scan direction before the exposure slit in the scan exposure moves to the exposure area 500. FIGS. 9 and 10 are schematic views of the measurement points K1 to K5 for the exposure area 500, in which FIG. 9 shows three measurement points K1 to K3 while FIG. 10 shows five measurement points K1 to K5.

FIG. 10 arranges five measurement points K1 to K5 to be projected in the front area 510 for the exposure area 500 so as to precisely obtain focus and tilt information just before the exposure to the exposure area 500, and drive and correct an exposure position. Similarly, five measurement points K1 to K5 are to be projected in the back area 520 for the scan exposure in the reverse direction.

Figure 11:
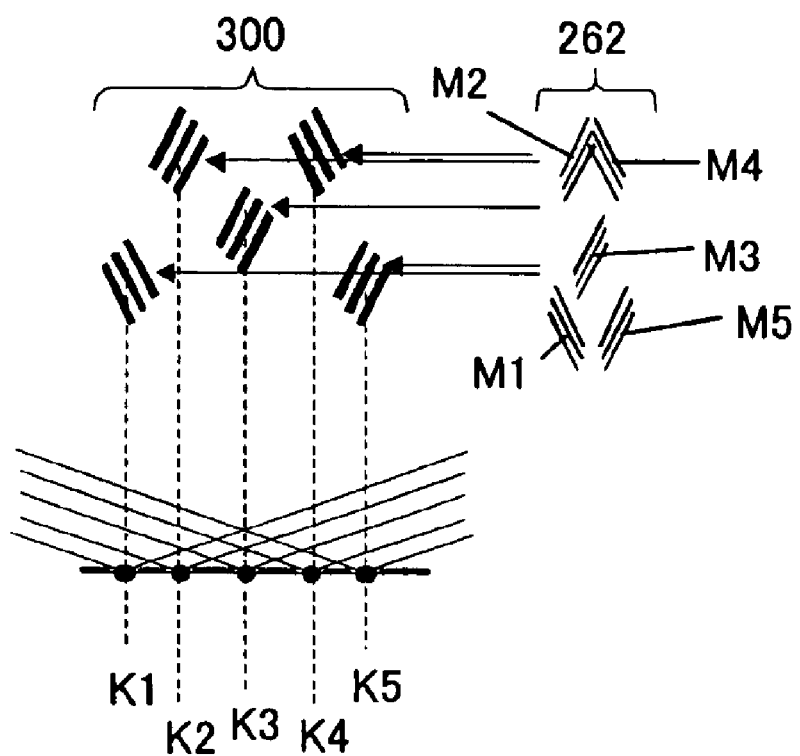
FIG. 11 is a schematic optical view showing a focus/tilt measurement system of an exposure apparatus shown in FIG. 8.

FIG. 11 shows an enlarged view of a shape of light for illumination so that the detection system 260 in the exposure apparatus 200 shown in FIG. 8 may detect wafer 300. Here, FIG. 11 is a schematic optical view showing a focus and tilt measurement system in the exposure apparatus 200, although FIG. 11 shows only five measurement points K1 to K5 in the focus and tilt measurement area (for instance, the front area 510) for illustrative convenience. In particular, the instant embodiment illustrates an arrangement of marks M2 to M5 wherein an interval between the measurement points K2 and K4 is different from that among the measurement points K1, K3 and K5. Plural optical axes for the focus and tilt measurement are aligned with a direction orthogonal to the scan direction. These marks M1 to M5 to be projected at the measurement points K1 to K5 are rotated by a certain amount in a section perpendicular to the optical axis of the focus and tilt measurement optical system and then projected. As a result, the measurement slit faces obliquely on the wafer 300 and the slit pitch direction directs to the central measurement position.

Figure 12:
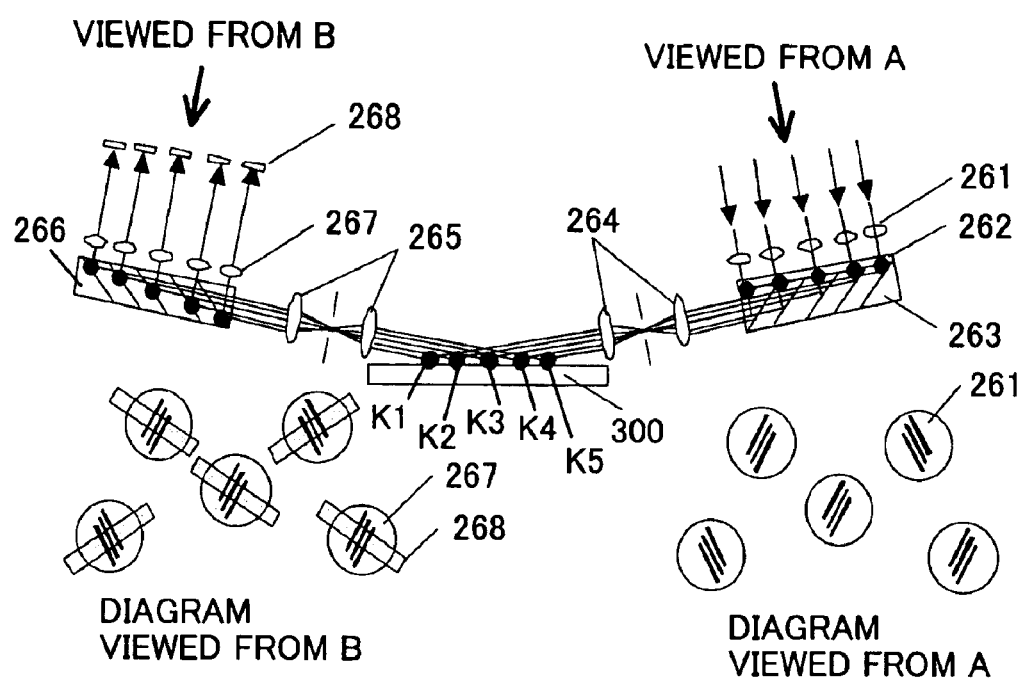
FIG. 12 is a schematic arrangement view of a measurement optical system that realizes an arrangement of measurement points shown in FIG. 11.

FIG. 12 is a schematic arrangement view of the measurement optical system for realizing an arrangement of the measurement points shown in FIG. 11. Five illumination lenses 261 allows the light supplied from the light source (not shown) to illuminate slit marks for the focus measurement formed on the projection pattern mask 262 for the focus and tilt measurements. The light source preferably employs a halogen lamp or LED with such a relatively wide wavelength that the light does not expose the photoresist on the wafer 300 or is not affected by interference in the resist thin film. The mask 262 forms slit marks for plural measurement points as shown in a diagram viewed from a direction A. An optical-path synthesizer prism 263 synthesizes optical paths of beams formed from illuminated plural measurement marks, and a focus mark projection optical system 264 projects the light onto the wafer 300 obliquely.

The light reflected on the wafer 300 surface forms an intermediate imaging point in an optical-path division prism 266 through the focus light-receiving optical system 265. After the optical-path division prism 266 divides the optical path for each measurement point, an enlargement detection optical system 267 arranged for each measurement point in order to improve measurement resolution introduces the light to a position detection element 268 for each measurement point. Each position detection element 268 uses one-dimensional CCD in this embodiment, and the arrangement direction of the elements is the measurement direction. A diagram viewed from the direction B shows a relationship among the measurement marks, the position detection element 268, and the enlargement detection optical system 267. The position detection element 268 for each measurement point is provided in a direction orthogonal to the slit mark.

The position detection element 268 uses a one-dimensional CCD, but may arrange a two-dimensional CCD. Alternatively, it may be adapted to form a reference slit plate on a light-receiving element imaging surface, scan light in front of the reference slit plate, and detect a transmission light volume through the reference slit plate.

Figure 13:
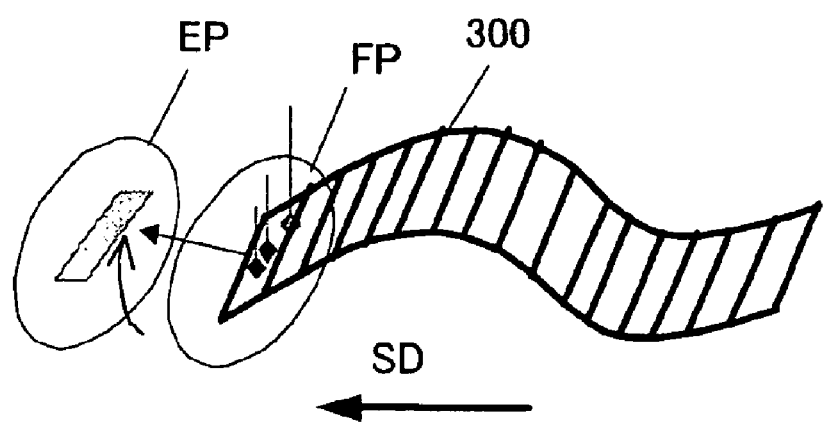
FIG. 13 is a schematic perspective view showing an exposure position and focus/tilt measurement positions on a wafer.
Figure 14:
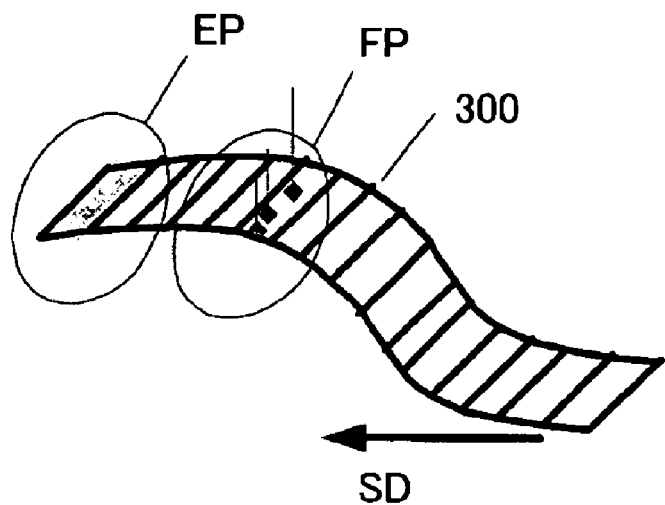
FIG. 14 is a schematic perspective view showing that a wafer is driven to an exposure position based on the flatness information of the wafer measured and stored in the memory.

A description will be given of an overview of a surface position correction in the focus and tilt measurement at the scan exposure. Before the exposure position EP moves to the wafer 300 with a rough shape in a scan direction SD, the focus of the surface position of the wafer 300, the tilt in the longitudinal direction in the exposure slit (or a direction perpendicular to the scan direction SD) (which tilt is referred to as "tilt X") as well as the tilt in the width direction in the exposure slit (which tilt is referred to as "tilt Y") are conducted, as shown in FIG. 13, plural focus and tilt positions FP arranged so as to form a plane in front of the exposure slit. Based on the information of the measurement and flatness information of the wafer 300 as a database stored in the memory 280, the controller 270 provides a corrective driving, as shown in FIG. 14, to drive the wafer stage 250 to the exposure position EP. In FIG. 14, the correction has been completed so as to expose the exposure slit when the exposure slit moves to the area that has been measured before the exposure. Here, FIG. 13 is a schematic perspective view showing the exposure position EP, focus and tilt measurement positions FP on the wafer 300. FIG. 14 is a schematic perspective view showing that the wafer 300 is driven to the exposure position EP based on flatness information of the wafer 300 measured and stored in the memory 280.

The above description refers to an arrangement of five measurement points in each surface position measurement area, but is applicable to an arrangement of three measurement points.

The present invention thus obtains detailed flatness information only for a shot having bad flatness after exposure in the initial exposure process in the semiconductor manufacture process, and uses the information for focusing and tilting of the wafer subsequent to the exposure in the initial exposure process. Of course, the present invention is not limited to one exposure apparatus.

For example, if there are plural exposure apparatuses 200 under condition that a limited exposure apparatus exposes each wafer 300, the flatness information of each wafer 300 may exist in the memory 280 in each of plural exposure apparatuses 200. However, the present invention works even when the exposure apparatus 200 that exposes a certain wafer 300 in one exposure process is not limited.

Figure 15:
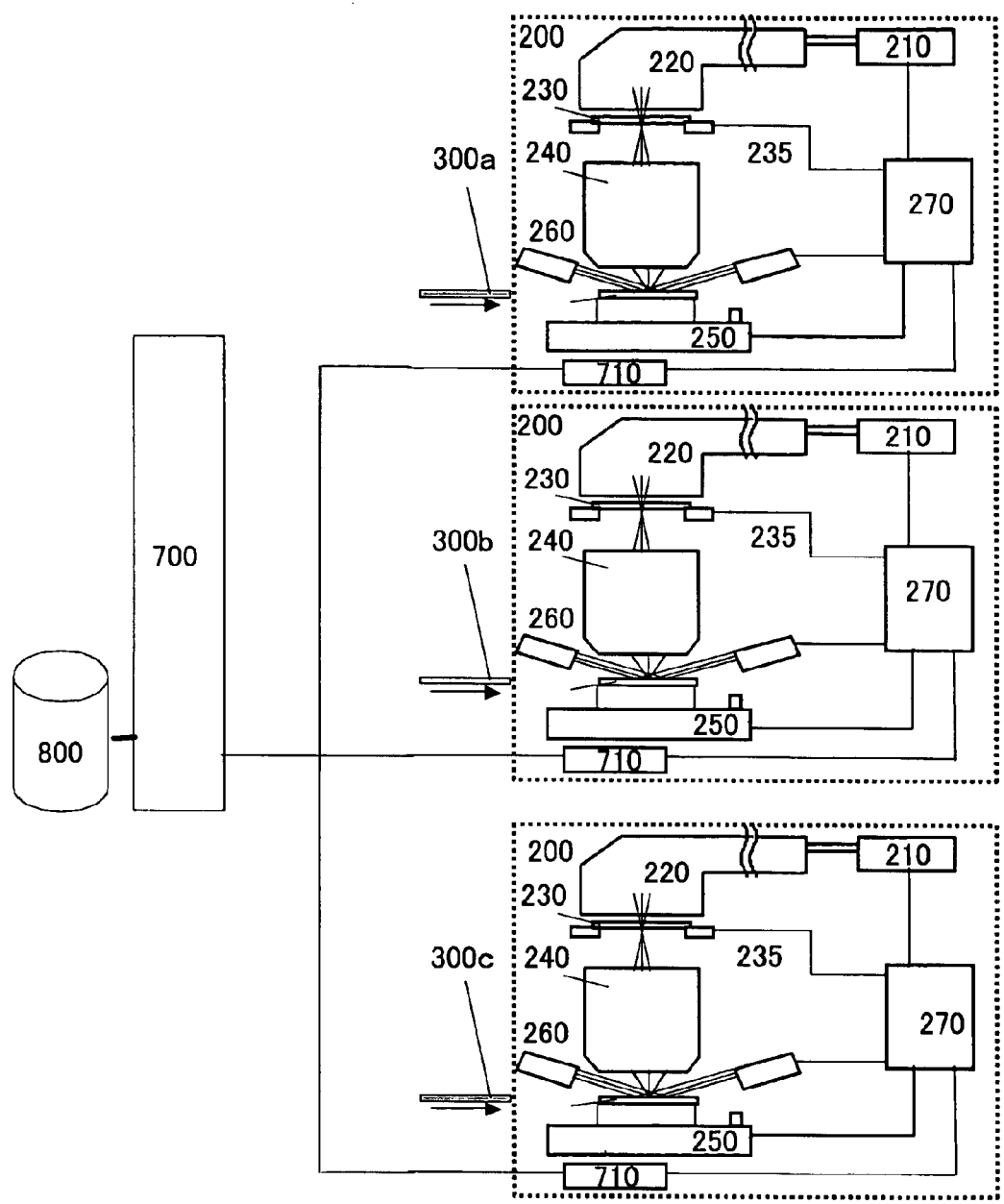
FIG. 15 is a schematic structure showing one embodiment that uses plural exposure apparatuses to expose a wafer.

FIG. 15 shows a schematic structure of one embodiment that uses plural exposure apparatuses 200 to expose wafers 300a to 300c. Plural exposure apparatuses 200 are connected to a main controller 700 that controls these apparatuses through a network 710, such as a LAN so that they may communicate data with one another. The flatness information of each of the wafers 300a to 300c is stored as a database in a memory 800 that may communicate with the main controller 700.

Thus, the flatness information of each of the wafers 300a to 300c stored in the memory 800 is sent to the controller 280 in the exposure apparatus 200 that exposes respective wafers 300a to 300c through the network 710 and the main controller 700, and used for focusing and tilting respective wafers 300a to 300c.

Figure 16:
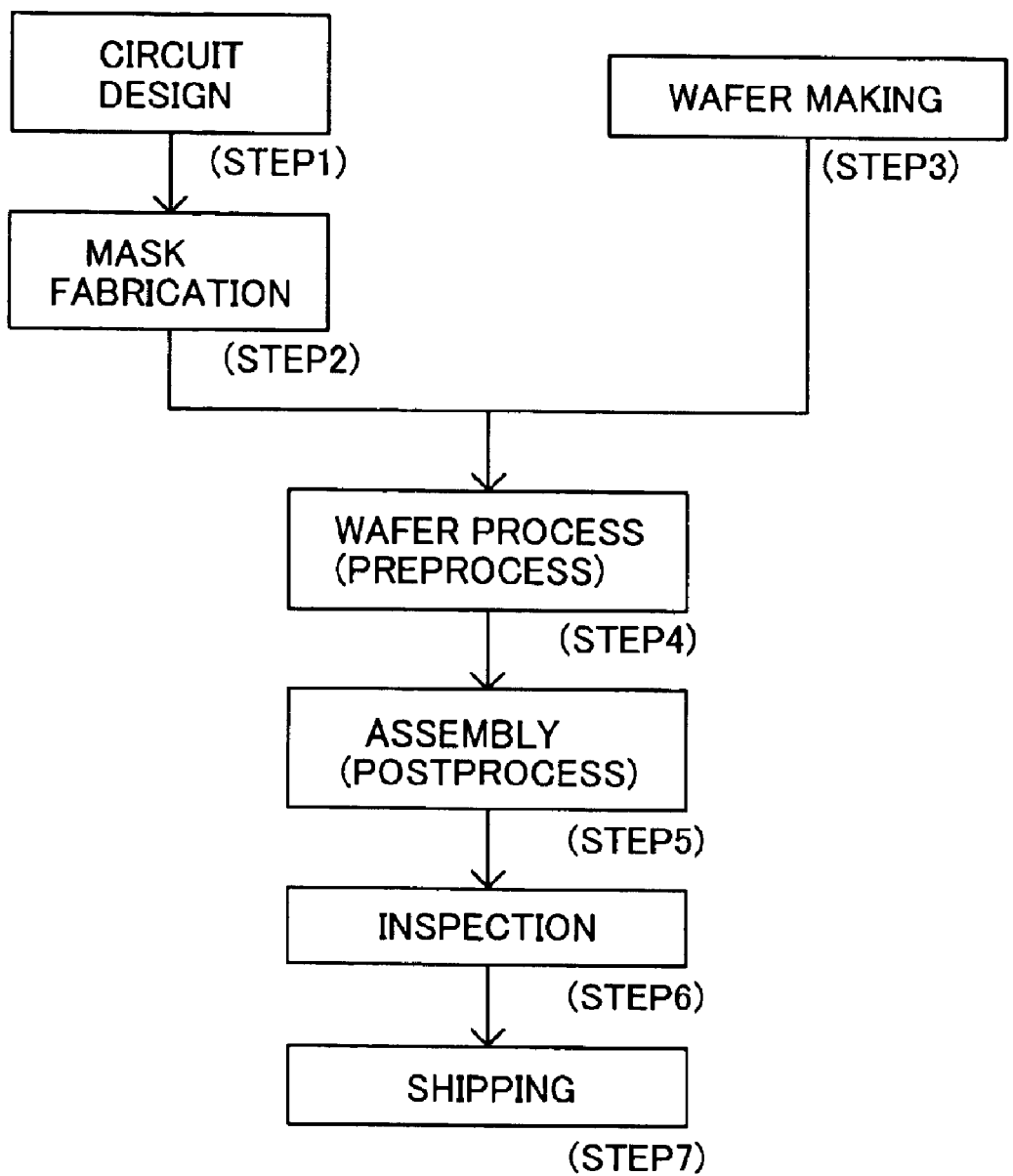
FIG. 16 is a flowchart for explaining a method for fabricating devices (semiconductor chips such as ICs, LSIs, and the like, LCDs, CCDs, etc.).

The flatness information for respective wafers 300a to 300c is not exclusively stored in the memory 800 near the main controller 700 in a factory that installs these exposure apparatuses 200, and the present invention may achieve its effects when the flatness information is stored at a distant place but the data may be communicated through the Internet, etc., Referring now to FIGS. 16 and 17, a description will be given of an embodiment of a device manufactire method using the above mentioned exposure apparatus 200. FIG. 16 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 17:
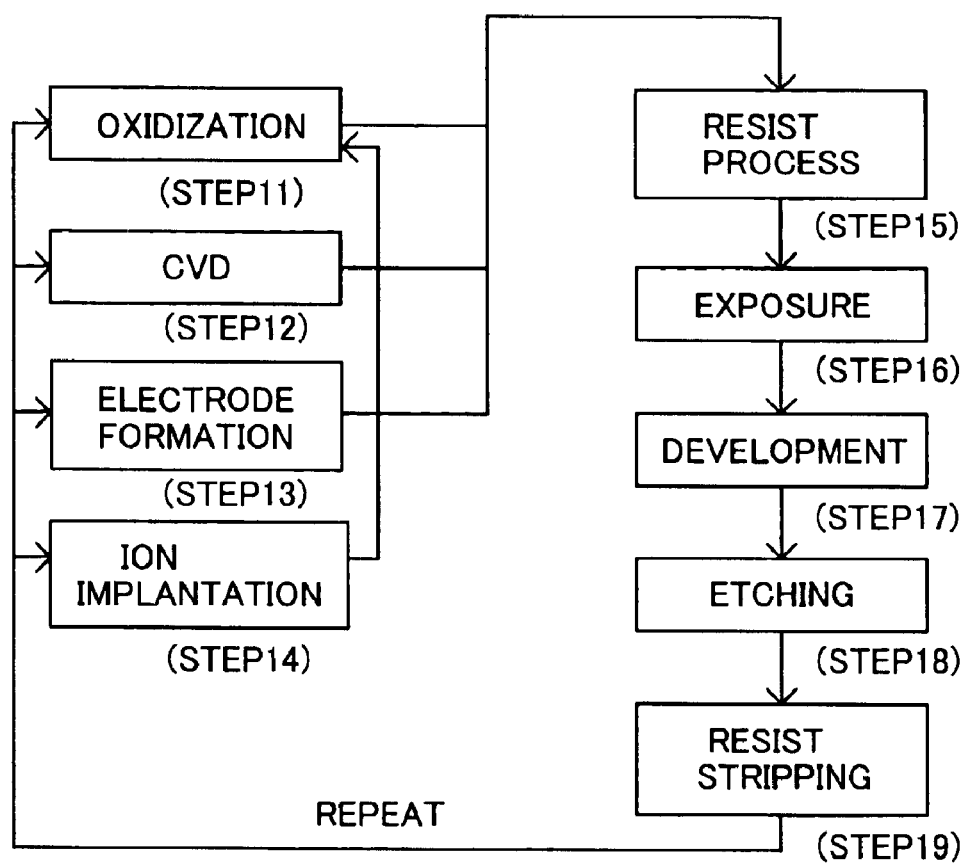
FIG. 17 is a detailed flowchart for Step 4 shown in FIG. 16.
Figure 18:
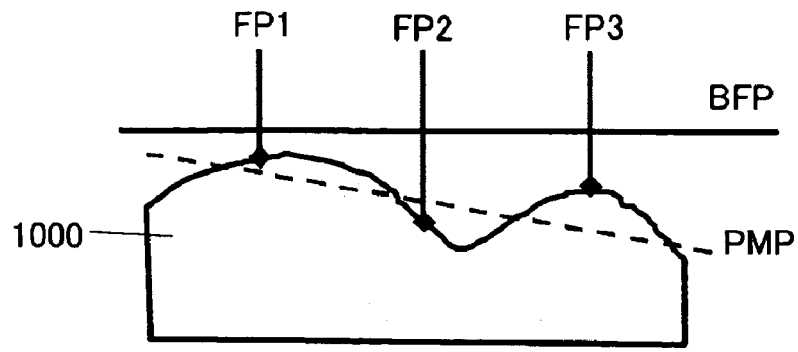
FIG. 18 is a schematic sectional view showing focus/tilt measurement positions on a wafer.
Figure 19:
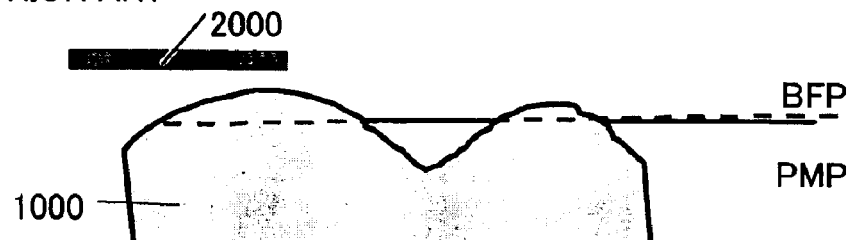
FIG. 19 is a schematic sectional view showing the wafer that has been driven to an optimal image-surface position based on the measurement result.
Figure 20:
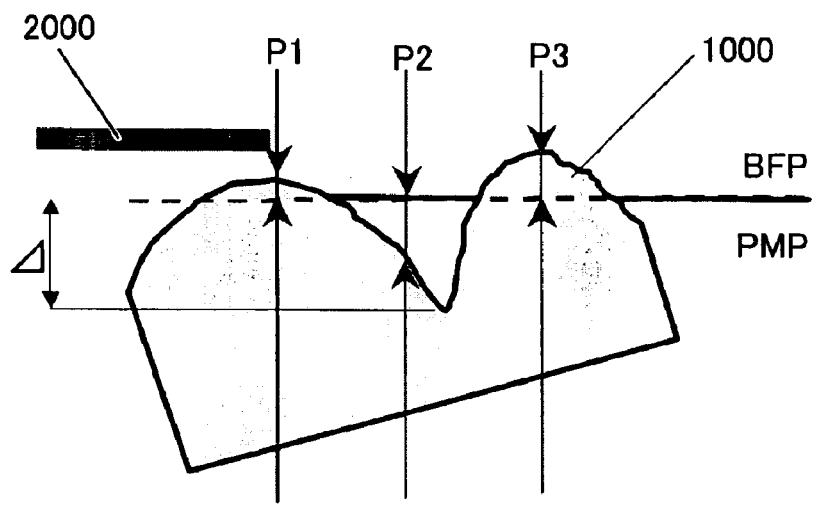
FIG. 20 is a schematic sectional view showing an offset between a pre-scan plane and the wafer.

FIG. 17 is a detailed flowchart of the wafer process in Step 4 in FIG. 16. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever. Thus, the device fabrication method using the exposure apparatus 1 and the resultant device constitute one aspect of the present invention.

Further, the present invention is not limited to these preferred embodiments and various variations and modifications may be made without departing from)the scope of the present invention.

Thus, the inventive exposure method and apparatus may provide an exposure method and apparatus for performing a superior focus correction for the wafer surface without lowering throughput.

What is claimed is:

1. An exposure method of exposing plural portions on an object to a pattern, said method comprising the steps of:

first measuring of heights of first plural points, arranged at a first interval, in each of the plural portions;

first exposing of each of the plural portions to a first pattern based on information of heights measured in said first measuring step;

specifying each of plural portions, which has a flatness less than a reference, of the plural portions based on the information of heights measured in said first measuring step;

second measuring of heights of second plural points, arranged at a second interval shorter than the first interval, in each of the plural portions specified in said specifying step; and storing information of heights measured in said second measuring step, the stored information used fore later exposure of each of the plural portions specified in said specifying step.

2. A method according to claim 1, further, in the later exposure, comprising the steps of:

third measuring of heights of the first plural points; and second exposing of each of the plural portions to a second pattern based on information of heights measured in said third measuring step, wherein said second exposing step exposes each of the plural portions specified in said specifying step to the second pattern based on the information of heights measured in said third measuring step and the information of heights stored in said storing step.

3. A method according to claim 1, wherein said first measuring step and said first exposing step are executed in parallel with each other.

4. A method according to claim 1 wherein said method exposes each of the plural portions plural times and said second measuring step is executed once between an initial exposure of each of the plural portions and an exposure of each of the plural portions subsequent to the initial exposure.

5. A method according to claim 1, wherein said first exposing step exposes each of the plural portions to the first pattern through a projection optical system, and said first measuring step measures positions, as the heights, of the first plural points in a direction substantially parallel to a direction of an optical axis of the projection optical system.

6. A method of manufacturing a device, said method comprising steps:
   exposing plural portions on an object to a pattern in accordance with an exposure method as defined in claim 1;
   developing the exposed object; and
   processing the developed object to manufacture the device.

7. An exposure apparatus for exposing plural portions on an object to a pattern, said apparatus comprising:
   a measuring system to measure heights of first plural points, arranged at a first interval, in each of the plural portions;
   a memory to store information of heights of second plural points, arranged at a second interval shorter than the first interval, in each of plural portions, of which a flatness is specified to be less than a reference, of the plural portions; and
   a controller to control an exposure of each of the plural portions to the pattern based on information of heights measured by said measuring system,
   wherein said controller controls an exposure of each of the plural portions, of which the flatness is specified to be less than the reference, to the pattern based on the information of heights measured by said measuring system and the information of heights stored in said memory.

8. An apparatus according to claim 7, wherein said controller specifies each of the plural portions which has the flatness less than the reference based on information of heights measured by said measuring system.

9. An apparatus according to claim 7, wherein the information of heights stored in said memory has been obtained by said measuring system.

10. An exposure apparatus according to claim 7, further comprising a drive mechanism for an orientation of the object, wherein said controller controls said drive mechanism based on the information of heights measured by said measuring system and the information of heights stored in said memory.

11. An apparatus according to claim 7, further comprising a projection optical system through which each of the plural portions is exposed to the pattern, wherein said measuring system measures positions, as the heights, of the first plural points in a direction substantially parallel to a direction of an optical axis of said projection optical system.

12. A method of manufacturing a device, said method comprising steps of:
   exposing plural portions on an object to a pattern using an exposure apparatus as defined in claim 7;
   developing the object; and
   processing the developed object to manufacture the device.

* * * * *